US012607685B2

(12) United States Patent
Lee et al.

(10) Patent No.: US 12,607,685 B2
(45) Date of Patent: Apr. 21, 2026

(54) BATTERY APPARATUS AND METHOD FOR PREDICTING BATTERY OUTPUT

(71) Applicant: LG ENERGY SOLUTION, LTD., Seoul (KR)

(72) Inventors: Sun Jong Lee, Daejeon (KR); Cheoltaek Kim, Daejeon (KR); Young Ho Kwon, Daejeon (KR); Yong Chul Sung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 790 days.

(21) Appl. No.: 17/912,613

(22) PCT Filed: Sep. 13, 2021

(86) PCT No.: PCT/KR2021/012424
§ 371 (c)(1),
(2) Date: Sep. 19, 2022

(87) PCT Pub. No.: WO2022/075618
PCT Pub. Date: Apr. 14, 2022

(65) Prior Publication Data
US 2023/0145602 A1 May 11, 2023

(30) Foreign Application Priority Data
Oct. 5, 2020 (KR) ........................ 10-2020-0127981

(51) Int. Cl.
*G01R 31/388* (2019.01)
*G01R 31/36* (2020.01)
(Continued)

(52) U.S. Cl.
CPC ....... *G01R 31/388* (2019.01); *G01R 31/3648* (2013.01); *G01R 31/367* (2019.01); *H01M 10/48* (2013.01)

(58) Field of Classification Search
CPC .............. G01R 31/388; G01R 31/3648; G01R 31/367; G01R 31/382
See application file for complete search history.

(56) References Cited

U.S. PATENT DOCUMENTS

2007/0114971 A1    5/2007    Uesaka et al.
2007/0145953 A1    6/2007    Asai et al.
(Continued)

FOREIGN PATENT DOCUMENTS

CN        110221222 A      9/2019
JP        2004-301783 A    10/2004
(Continued)

OTHER PUBLICATIONS

International Search Report (with partial translation) and Written Opinion dated Jan. 7, 2022, issued in corresponding International Application No. PCT/KR2021/012424.
(Continued)

*Primary Examiner* — Ricky Go
(74) *Attorney, Agent, or Firm* — Morgan, Lewis & Bockius LLP

(57) ABSTRACT
A battery apparatus estimates a surface SOC representing a potential at an electrode surface of the battery, and predicts an output of the battery during a requested time based on the first surface SOC, a cut-off voltage, and the requested time.

20 Claims, 8 Drawing Sheets

(51) Int. Cl.
  G01R 31/367    (2019.01)
  H01M 10/48    (2006.01)

(56)        References Cited

U.S. PATENT DOCUMENTS

| | | | |
|---|---|---|---|
| 2010/0153038 A1* | 6/2010 | Tomura | G01R 31/3842 |
| | | | 702/63 |
| 2013/0119921 A1* | 5/2013 | Choe | H01M 10/48 |
| | | | 320/106 |
| 2014/0239915 A1 | 8/2014 | Takahashi | |
| 2015/0260798 A1 | 9/2015 | Sugiyama et al. | |
| 2015/0316618 A1 | 11/2015 | Lou et al. | |
| 2016/0187429 A1 | 6/2016 | Kawai et al. | |
| 2016/0238664 A1 | 8/2016 | Kim | |
| 2017/0052228 A1* | 2/2017 | Hariharan | G01R 31/3842 |
| 2018/0090962 A1 | 3/2018 | Cha et al. | |
| 2018/0215283 A1 | 8/2018 | Matsusue et al. | |
| 2018/0375176 A1 | 12/2018 | Sakabe et al. | |
| 2019/0178948 A1* | 6/2019 | Takahashi | G01R 31/374 |
| 2019/0232947 A1 | 8/2019 | Tashiro | |
| 2021/0013731 A1 | 1/2021 | Choe et al. | |

FOREIGN PATENT DOCUMENTS

| | | | |
|---|---|---|---|
| JP | 2007-147487 A | 6/2007 | |
| JP | 2007-179968 A | 7/2007 | |
| JP | 2015-175753 A | 10/2015 | |
| JP | 5835341 B2 | 12/2015 | |
| JP | 2016-126999 A | 7/2016 | |
| JP | 2017-107763 A | 6/2017 | |
| JP | 2018-129136 A | 8/2018 | |
| JP | 2019-134504 A | 8/2019 | |
| JP | 6635062 B2 | 1/2020 | |
| KR | 10-1192713 B1 | 10/2012 | |
| KR | 10-2013-0053064 A | 5/2013 | |
| KR | 10-1611123 B1 | 4/2016 | |
| KR | 10-2017-0022855 A | 3/2017 | |
| KR | 10-2018-0082020 A | 7/2018 | |
| KR | 10-1976874 B1 | 5/2019 | |
| KR | 10-2014451 B1 | 8/2019 | |
| KR | 10-2020-0069203 A | 6/2020 | |
| WO | 2018/141723 A1 | 8/2018 | |
| WO | 2019/116815 A1 | 6/2019 | |
| WO | 2019/124187 A1 | 6/2019 | |

OTHER PUBLICATIONS

Alexander Farmann et al., "Critical review of on-board capacity estimation techniques for lithium-ion batteries in electric and hybrid electric vehicles," Journal of Power Sources, Elsevier, Amsterdam, NL, vol. 281, Jan. 22, 2015, pp. 114-130.

Jinglong Chen et al., "A Simplified Extension of Physics-Based Single Particle Model for Dynamic Discharge Current," IEEE Access, vol. 7, Dec. 23, 2019, pp. 186217-186227.

Extended European Search Report dated Oct. 10, 2024 issued in corresponding European Application No. 21877870.2. (Note—US 2015/0316618 A1 cited in this EESR was cited in a prior IDS.).

Notice of Reasons for Rejection issued Oct. 3, 2023 for corresponding Japanese Patent Application No. 2022-552481.

* cited by examiner

FIG. 5

| SOC / Temperature | 100% | · · · · | 5% |
|---|---|---|---|
| -40℃ | K1 | · · · · | K2 |
| ⋮ | ⋮ | | ⋮ |
| 60℃ | K3 | · · · · | K4 |

FIG. 6

| SOC / Temperature | 100% | · · · · | 5% |
|---|---|---|---|
| -40℃ | D1 | · · · · | D2 |
| ⋮ | ⋮ | | ⋮ |
| 60℃ | D3 | · · · · | D4 |

FIG. 12

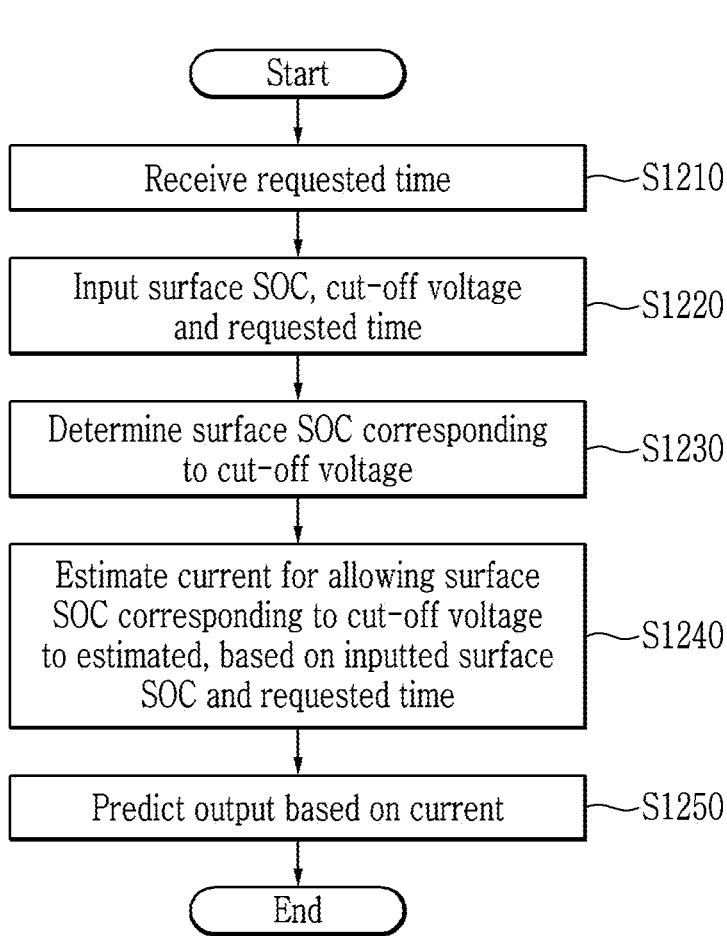

Start

Receive requested time —S1210

Input surface SOC, cut-off voltage and requested time —S1220

Determine surface SOC corresponding to cut-off voltage —S1230

Estimate current for allowing surface SOC corresponding to cut-off voltage to estimated, based on inputted surface SOC and requested time —S1240

Predict output based on current —S1250

End

Surface SOC →

SOC →

Output Prediction Model → Output

Cut-off voltage    Derating voltage    Requested time

BATTERY APPARATUS AND METHOD FOR PREDICTING BATTERY OUTPUT

TECHNICAL FIELD

Cross-Reference to Related Application

This application claims priority to and the benefit of Korean Patent Application No. 10-2020-0127981 filed in the Korean Intellectual Property Office on Oct. 5, 2020, the entire contents of which are incorporated herein by reference.

The described technology relates to a battery apparatus and a method for predicting a battery output.

BACKGROUND ART

An electric vehicle or a hybrid vehicle is a vehicle that obtains power by driving a motor mainly using a battery as a power source. The electric vehicles are being actively researched because they are alternatives that can solve pollution and energy problems of internal combustion vehicles. Rechargeable batteries are used in various external apparatuses other than the electric vehicles.

In order to use the battery in various external apparatuses, it is necessary to predict an output of the battery. A battery management system stores in advance a maximum output power (maximum discharge current or maximum charge current) for a predetermined time based on a state of charge (SOC) of the battery and a temperature of the battery, and provides an output power based on the maximum output power corresponding to a current SOC and a current temperature in response to a request from the external apparatus.

However, in a case of using the previously-stored values, if the external apparatus requests an output power for a time which is not stored, the output power cannot be provided. Further, even if the SOC and the temperature are in the same states, the output power for the predetermined time of the battery in a static state may be different from that of the battery in a dynamic state in which charging or discharging is repeated. Therefore, when the external apparatus requests the output power for the predetermined time, a method for predicting an output power for a requested time based on a current state of the battery is required.

DISCLOSURE

Technical Problem

Some embodiments may provide a battery apparatus and a method of predicting a battery output, for predicting an output during any time.

Technical Solution

According to an embodiment, a battery apparatus including a battery and a processor may be provided. The processor may estimate a surface state of charge (SOC) representing a potential at an electrode surface of the battery as a first surface SOC, and predict an output of the battery during a requested time based on the first surface SOC, a cut-off voltage, and the requested time.

In some embodiments, the processor may determine the surface SOC at a time when a terminal voltage of the battery becomes the cut-off voltage as a second surface SOC, estimate a current of the battery for allowing the second surface SOC to be estimated from the first surface SOC after the requested time, and predict the output based on the current.

In some embodiments, the processor may determine an open circuit voltage of the battery at the time when the terminal voltage of the battery becomes the cut-off voltage, and determine the second surface SOC based on the open circuit voltage.

In some embodiments, the processor may estimate a current of the battery for allowing a second surface SOC to be estimated from the first surface SOC after the requested time, and predict the output based on the current of the battery. In this case, a terminal voltage of the battery determined based on the second surface SOC and the current may be the cut-off voltage.

In some embodiments, the terminal voltage may be determined based on an open circuit voltage of the battery corresponding to the second surface SOC and a voltage corresponding to the current.

In some embodiments, the terminal voltage may be determined based on the open circuit voltage of the battery, the voltage corresponding to the current, and an overpotential of the battery.

In some embodiments, the processor may determine the cut-off voltage based on a temperature of the battery.

In some embodiments, the processor may decrease the predicted output in response to a voltage of the battery corresponding to the predicted output reaching a derating voltage.

In some embodiments, the processor may estimate the first surface SOC based on a plurality of parameters including a first parameter determined based on a measured current of the battery and a second parameter determined based on an SOC of the battery.

According to another embodiment, a method of predicting an output of a battery may be provided. The method may include estimating a state of the battery, and predicting an output of the battery during a requested time based on the state of the battery, a cut-off voltage, and the requested time.

In some embodiments, the state of the battery may include a surface SOC representing a potential at an electrode surface of the battery.

In some embodiments, predicting the output of the battery may include estimating a current of the battery for allowing a specific surface SOC to be estimated from the estimated surface SOC after the requested time, and predicting the output based on the current. In this case, a terminal voltage of the battery determined based on the specific surface SOC and the current may be the cut-off voltage.

In some embodiments, the terminal voltage may be determined based on an open circuit voltage of the battery corresponding to the specific surface SOC and a voltage corresponding to the current.

In some embodiments, estimating the state of the battery may include estimating the surface SOC based on a plurality of parameters including a first parameter determined based on a measured current of the battery and a second parameter determined based on an SOC of the battery.

According to yet another embodiment, a program configured to be executed by a processor of a battery apparatus and be stored in a recording medium may be provided. The program may cause the processor to execute estimating a state of the battery, and predicting an output of the battery during a requested time based on the state of the battery, a cut-off voltage, and the requested time.

Advantageous Effects

According to some embodiments, it is possible to accurately predict and provide power that the battery can provide for a time requested by the external apparatus in real time.

BRIEF DESCRIPTION OF THE DRAWINGS

FIG. 5 is a diagram showing an example of a correspondence relationship between a temperature/SOC and a kinetics coefficient in a battery according to an embodiment.

FIG. 6 is a diagram showing an example of a correspondence relationship between a temperature/SOC and a diffusion coefficient in a battery according to an embodiment.

FIG. 12 is a flowchart showing a battery output prediction method in a battery management system according to an embodiment.

FIG. 13 is a diagram for explaining battery output prediction in a battery management system according to another embodiment.

MODES FOR INVENTION

Figure 1:
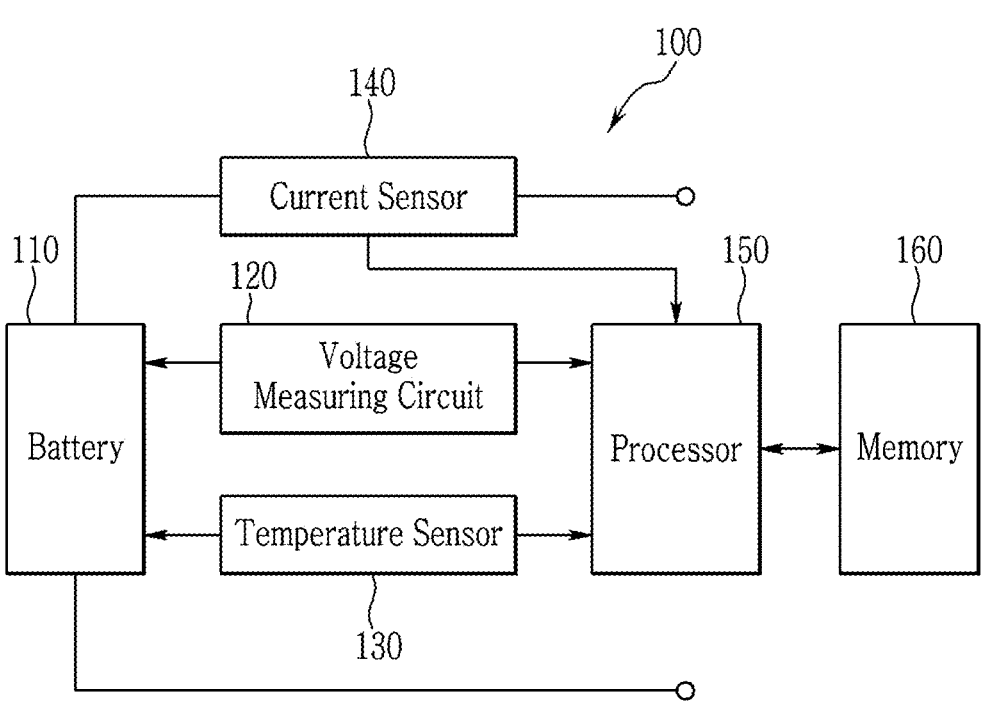
FIG. 1 is a drawing showing a battery apparatus according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

Figure 2:
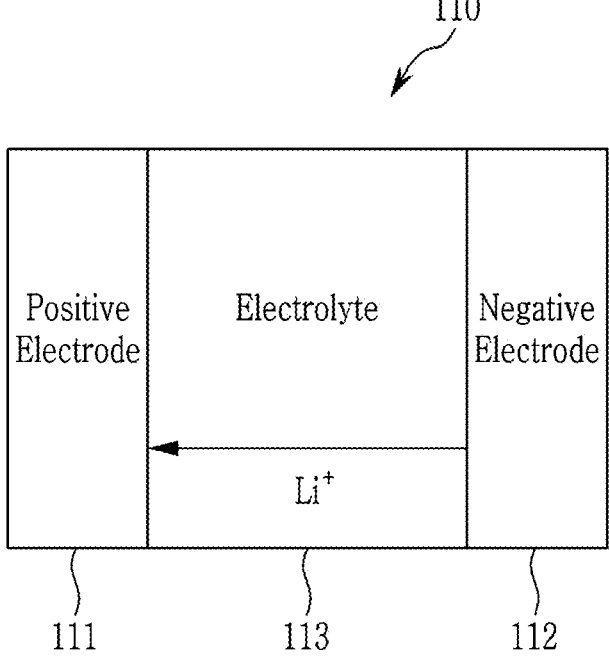
FIG. 2 is a diagram showing a structure of a battery according to an embodiment.
Figure 3:
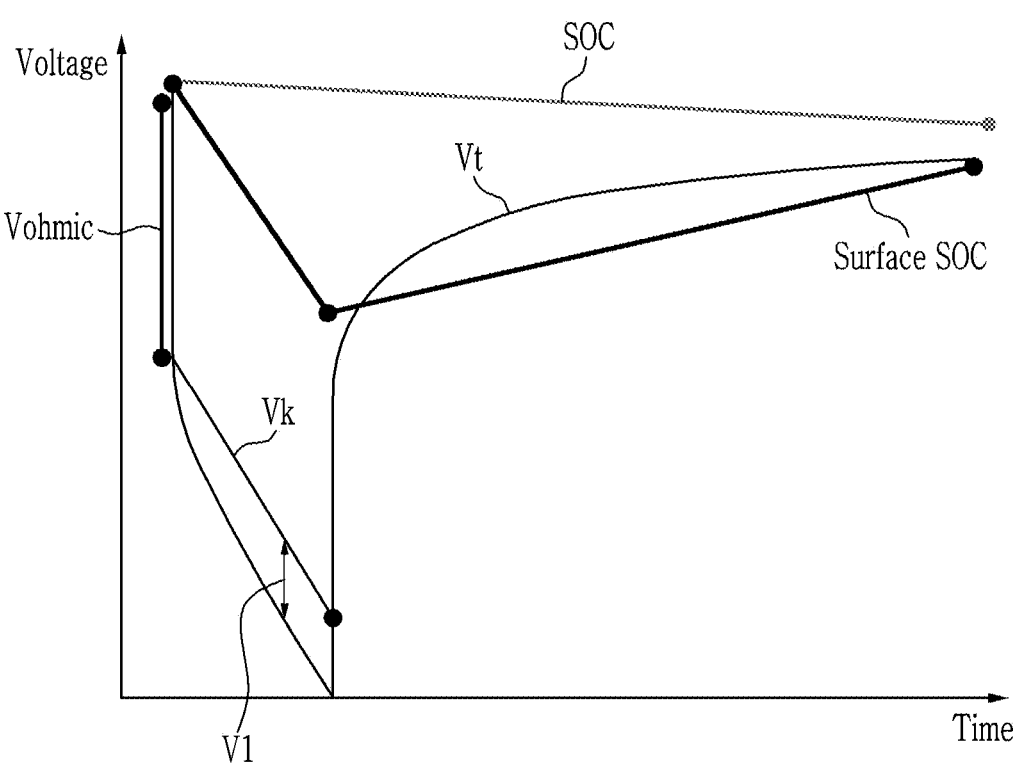
FIG. 3 is a diagram showing an example of a state change in a battery.

FIG. 1 is a drawing showing a battery apparatus according to an embodiment, FIG. 2 is a diagram showing a structure of a battery according to an embodiment, and FIG. 3 is a diagram showing an example of a state change in a battery.

Referring to FIG. 1, a battery apparatus 100 has a structure that can be electrically connected to an external apparatus. When the external apparatus is a load, the battery apparatus 100 is discharged by operating as a power supply that supplies power to the load. When the external apparatus is a charger, the battery apparatus 100 is charged by receiving external power through the charger. The external apparatus operating as the load may be, for example, an electronic device, a mobility apparatus, or an energy storage system (ESS). The mobility apparatus may be, for example, a vehicle such as an electric vehicle, a hybrid vehicle, or a smart mobility.

The battery apparatus 100 includes a battery 110, a voltage measuring circuit 120, a temperature sensor 130, a current sensor 140, and a processor 150.

The battery 110 is a rechargeable battery. The battery 100 may be, for example, a lithium battery such as a lithium ion battery or a lithium ion polymer battery, or a nickel battery such as a nickel-cadmium (NiCd) battery or a nickel-metal hydride (NiMH) battery. In some embodiments, the battery 100 may be a single battery cell, a battery module including an assembly of a plurality of battery cells or in which a plurality of assemblies are connected in series or parallel, a battery pack in which a plurality of battery modules are connected in series or parallel, or a system in which a plurality of battery packs are connected in series or parallel.

The voltage measuring circuit 120 measures a voltage of the battery 110. In some embodiments, the voltage measurement circuit 120 may measure a voltage of each battery cell.

The temperature sensor 130 measures a temperature of the battery 110. In some embodiments, the temperature sensor 130 may measure a temperature at a predetermined location of the battery 110. In some embodiments, a plurality of temperature sensors 130 may be provided to measure temperatures at a plurality of locations in the battery 110.

The current sensor 140 is connected to a positive output terminal or negative output terminal of the battery 110, and measures a current of the battery 110, i.e., a charging current or a discharging current.

The processor 150 estimates a state of the battery 110 based on the voltage of the battery 110 measured by the voltage measuring circuit 120, the temperature of the battery 110 measured by the temperature sensor 130, or the current of the battery 110 measured by the current sensor 140. In some embodiments, the battery apparatus 100 may further include a memory 160 that stores data necessary for state estimation in the processor 150.

In some embodiments, the processor 150 may form a battery management system. In some embodiments, the battery management system may further include at least one of the voltage measurement circuit 120, the temperature sensor 130, or the current sensor 140.

Referring to FIG. 2, the battery 110 includes a positive electrode (or cathode) 111, a negative electrode (or anode) 112, and an electrolyte 113. A structure of the battery 110 shown in FIG. 2 is a schematic example for convenience of description, and the structure of the battery 110 is not limited thereto. In FIG. 2, for convenience of description, it is assumed that lithium is an active material causing a chemical reaction in the battery 110.

When the battery 110 is discharged in order to supply power from the battery 110 to an external apparatus, as shown in FIG. 2, a chemical reaction (oxidation reaction) in which a lithium ion $Li^+$ are discharged from the negative electrode 112 may occur on a surface of the negative electrode 112. The discharged lithium ion $Li^+$ may pass through the electrolyte 113 and then move to a surface of the positive electrode 111. Accordingly, a chemical reaction (reduction reaction) in which the lithium ion $Li^+$ is absorbed into the positive electrode 111 may occur on the surface of the positive electrode 111.

When the battery 110 is charged, a chemical reaction (oxidation reaction) in which a lithium ion $Li^+$ is discharged from the positive electrode 111 may occur on a boundary surface between the positive electrode 111 and the electrolyte 113. The discharged lithium ion $Li^+$ may pass through the electrolyte 113 and then move to the surface of the negative electrode 112. Accordingly, a chemical reaction (reduction reaction) in which the lithium ion $Li^+$ is absorbed into the negative electrode 112 may occur on the surface of the negative electrode 112.

A terminal voltage of the battery 110 may be appeared in a form of summing a potential at a battery electrode surface corresponding to the positive electrode 111 and the negative electrode 112, voltage drop due to an ohmic resistance (internal resistance) formed by the electrolyte 113 and the like, and an over-potential due to electrochemical reaction. The overpotential may represent voltage drop occurred by deviation from an equilibrium potential due to polarization at each battery electrode. The overpotential is also called a polarization voltage.

As shown in FIG. 3, when the battery 110 starts discharging, the terminal voltage Vt of the battery 110 momentarily drops due to the voltage drop Vohmic by the ohmic resistance Rohmic, and then gradually decreases due to a transient change V1 of the overpotential. In general, the transient change V1 of the overpotential may be expressed as a change depending on a time constant defined in a parallel circuit of a resistor and a capacitor. At this time, the actual terminal voltage Vt of the battery 110 decreases with a constant slope along with the transient change V1 of the overpotential. That is, as shown in FIG. 3, a decrease Vk according to the constant slope and a decrease V1 according to the transient change of the overpotential appear together. This slope is determined by a magnitude of a current flowing through the battery 110. As described above, the phenomenon in which the terminal voltage Vt of the battery 110 decreases with the certain slope occurs because concentration of the active material on the electrode surface due to an oxidation/reduction reaction of the active material is lower than an average concentration. That is, the voltage change Vk according to the constant slope may occur by a voltage change (change due to discharging or charging) caused by an oxidation/reduction reaction rate and a voltage change caused by a diffusion resistance (concentration difference) in a relaxation period after the current disappears.

In general, a state of the battery 110 is determined as a state of charge (SOC) representing an average concentration at the whole of the battery 110, and the terminal voltage Vt of the battery 110 is estimated based on the open circuit voltage of the battery 110, the voltage drop (Vohmic) due to the ohmic resistance (Rohmic), and the overpotential. At this time, the open circuit voltage is estimated based on the SOC of the battery 110. However, the SOC represents the average concentration (e.g., the average concentration at the electrode) inside the battery 110 rather than the concentration on the surface of the battery electrode, and gradually decreases when the battery 110 is discharged as shown in FIG. 3. Therefore, when the open circuit voltage of the battery 110 is estimated based on the SOC, the terminal voltage of the battery 110 may not be accurately estimated. Accordingly, in some embodiments, a surface state of charge (SOC) capable of determining the potential at the electrode surface of the battery 110 is provided. Such a surface SOC may represent the concentration of the active material on the electrode surface of the battery 110.

Figure 4:
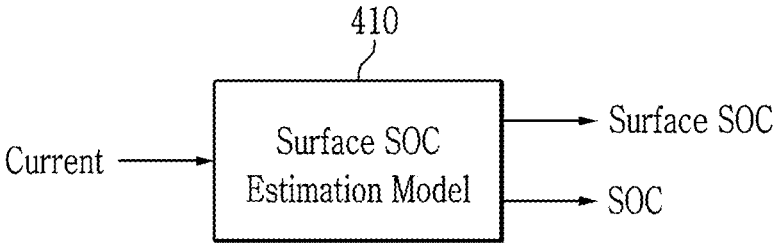
FIG. 4 is a diagram for explaining surface SOC estimation in a battery management system according to an embodiment.

FIG. 4 is a diagram for explaining surface SOC estimation in a battery management system according to an embodiment, FIG. 5 is a diagram showing an example of a correspondence relationship between a temperature/SOC and a kinetics coefficient in a battery according to an embodiment, and FIG. 6 is a diagram showing an example of a correspondence relationship between a temperature/SOC and a diffusion coefficient in a battery according to an embodiment.

Referring to FIG. 4, a processor (e.g., 150 in FIG. 1) of a battery management system may estimate a surface SOC of a battery (e.g., 110 in FIG. 1) based on measured information of the battery 110 including a current of the battery 110, using a surface SOC estimation model 410. In some embodiments, the surface SOC may be estimated as a percentage. In some embodiments, the processor 150 may estimate an SOC of the battery 110 representing an average concentration based on the measured information of the battery including the current of the battery 110, using the surface SOC estimation model 410.

As described with reference to FIG. 3, when the battery 110 is discharged, a terminal voltage of the battery 110 may decrease with a certain slope. Since the phenomenon in which the terminal voltage of the battery 110 decrease with the certain slope occurs because concentration of an active material on an electrode surface decreases by an oxidation/ reduction reaction of the active material, the certain slope is proportional to the current of the battery 110. Accordingly, the surface SOC estimation model 410 may estimate the surface SOC based on the reaction rate determined by the current of the battery 110. In some embodiments, a reaction rate (kinetics) may be determined based on a value obtained by reflecting a specific coefficient to the current of the battery 110. Hereinafter, such a specific factor is referred to as a "kinetics coefficient". In one embodiment, the reaction rate may be determined based on a product of the current of the battery 110 and the kinetics coefficient.

The reaction rate of the oxidation/reduction reaction may be determined by the temperature of the battery 110 and the average concentration inside the battery 110. Thus, in some embodiments, the kinetics coefficient may vary depending on the temperature of the battery 110 and the SOC of the battery 110. In one embodiment, the SOC of the battery 110 may include the SOC of the battery 110 representing the average concentration. In another embodiment, the SOC of the battery 110 may include the surface SOC of the battery 110. In yet another embodiment, the SOC of the battery 110 may include the SOC of the battery 110 representing the average concentration and the surface SOC of the battery 110. That is, the surface SOC estimation model 410 may determine the kinetics coefficient based on the temperature of the battery 110 and the SOC of the battery 110. In some embodiments, as shown in FIG. 5, a correspondence relationship between the temperature/SOC of the battery 110 and the kinetics coefficient may be predefined through experiments. In some embodiments, a memory of the battery management system may store such correspondence relationship, for example, in the form of a lookup table. In some embodiments, the surface SOC estimation model 410 may determine the kinetics coefficient based on either the temperature of the battery 110 or the SOC of the battery 110.

When the concentration on the electrode surface is lower than the average concentration by the oxidation/reduction reaction on the electrode surface, a resistance component in which the reaction on the electrode surface is lowered by a diffusion rate caused by a concentration difference between the concentration on the electrode surface and the average concentration may appear. Such a resistance caused by the diffusion (hereinafter referred to as a "diffusion resistance") may be expressed as a force that suppresses the oxidation/reduction reaction in a reverse direction. Therefore, the surface SOC estimation model 410 additionally reflects the diffusion resistance when estimating the surface SOC. In some embodiments, the diffusion resistance may be determined based on a difference between the SOC representing the average concentration and the surface SOC representing the concentration on the electrode surface. In some embodiments, the surface SOC estimation model 410 may estimate the surface SOC based on a value obtained by reflecting a specific coefficient to the difference between the SOC and the surface SOC. Hereinafter, such a specific coefficient is referred to as a "diffusion coefficient". In one embodiment, the surface SOC estimation model 410 may estimate the surface SOC based on a product of the diffusion coefficient and the difference between the SOC and the surface SOC.

The reaction rate of the oxidation/reduction reaction may be determined based on the temperature of the battery 110 and the average concentration inside the battery 110. Thus, in some embodiments, the diffusion coefficient that suppresses the oxidation/reduction reaction may vary depending on the temperature of the battery 110 and the SOC of the battery 110. In one embodiment, the SOC of the battery 110 may include the SOC of the battery 110 representing an average concentration. In another embodiment, the SOC of the battery 110 may include the surface SOC of the battery 110. In yet another embodiment, the SOC of the battery 110 may include the SOC of the battery 110 representing the average concentration and the surface SOC of the battery 110. That is, the surface SOC estimation model 410 may determine the diffusion coefficient based on the temperature of the battery 110 and the SOC of the battery 110. In some embodiments, as shown in FIG. 6, a correspondence relationship between the temperature/SOC of the battery 110 and the diffusion coefficient may be predefined through experiments. In some embodiments, the memory of the battery management system may store the correspondence relationship, for example, in the form of a lookup table. In some embodiments, the surface SOC estimation model 410 may determine the diffusion coefficient based on either the temperature of the battery 110 or the SOC of the battery 110.

In some embodiments, the surface SOC estimation model 410 may estimate the surface SOC at a current time point by reflecting at least a change due to the reaction rate from a previous time point to the current time point and a change due to the diffusion resistance from the previous time point to the current time point to the surface SOC estimated at the previous time point. In some embodiments, the processor 150 may predefine an initial value SSOC[0] of the surface SOC for estimating the surface SOC.

Figure 7:
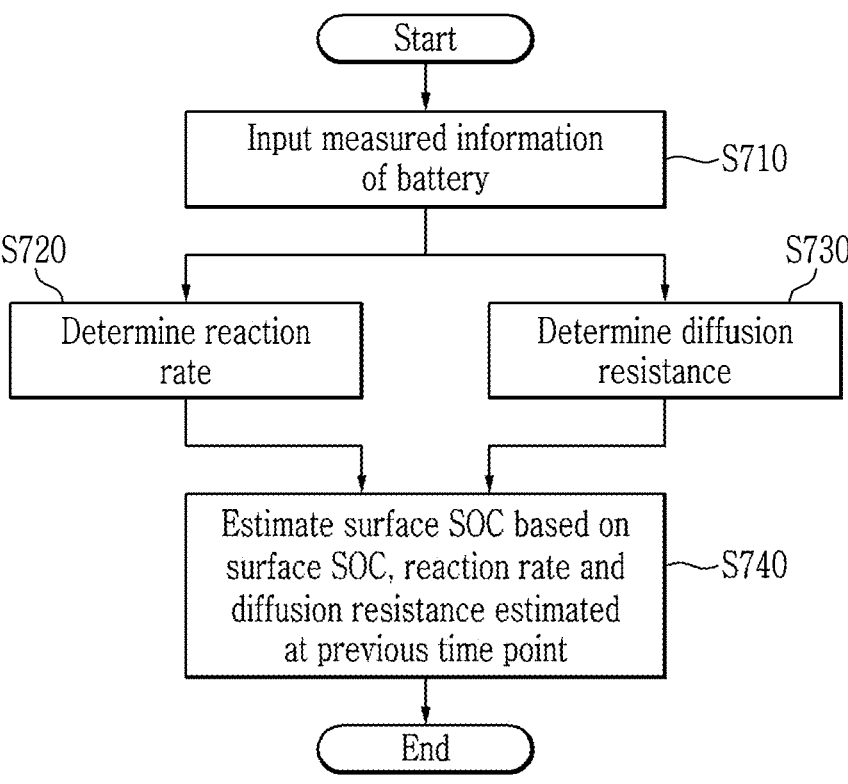
FIG. 7 is a flowchart showing a surface SOC estimation method in a battery management system according to an embodiment.

FIG. 7 is a flowchart showing a surface SOC estimation method in a battery management system according to an embodiment.

Referring to FIG. 7, a processor (e.g., 150 in FIG. 1) inputs measured information of a battery (e.g., 110 in FIG. 1) to a surface SOC estimation model at S710. The measured information of the battery 110 may include a current of the battery 110. In some embodiments, the current of the battery 110 may be a charging or discharging current of the battery 110 measured by a current sensor (e.g., 140 in FIG. 1). In some embodiments, the measured information of the battery 110 may further include a measured voltage of the battery 110. In some embodiments, the measured voltage of the battery 110 may be an average cell voltage, and the average cell voltage may be an average value of voltages of a plurality of battery cells. In some embodiments, the measured voltage of the battery 110 may be a sum of voltages of the plurality of battery cells. In some embodiments, the measured information of the battery 110 may further include a temperature of the battery 110. In some embodiments, the temperature of the battery 110 may be a temperature measured by a temperature sensor (e.g., 130 in FIG. 1).

The processor 150 determines a plurality of parameters at time point t using the surface SOC estimation model at S720 and S730. The plurality of parameters may include a parameter corresponding to a reaction rate and a parameter corresponding to a diffusion resistance.

The processor 150 determines the reaction rate K[t] of the battery 110 at time point t using the surface SOC estimation model at S720. The processor 150 may calculate the reaction rate K[t] as a product Kc*I[t] of a kinetics coefficient Kc and the temperature of the battery 110 at time point t. In some embodiments, the processor 110 may extract the kinetics coefficient Kc corresponding to the temperature of the battery 110 and the SOC of the battery 110 from a memory. In some embodiments, the memory may be a memory (e.g., 160 in FIG. 1) of a battery management system. In some embodiments, the processor 150 may estimate the SOC of the battery 110 based on the measured information of the battery 110. In some embodiments, the processor 150 may estimate the SOC using any one of various known methods, and the present invention is not limited to the method of estimating the SOC.

In addition, the processor 150 determines the diffusion resistance D[t] of the battery 110 at time point t using the surface SOC estimation model at S730. The processor 150 may calculate the diffusion resistance D[t] as a product Dc*ΔSOC[t] of a difference ΔSOC[t] between the SOC and the surface SOC at time point t and the diffusion coefficient Dc. In some embodiments, the processor 110 may extract the diffusion coefficient Dc corresponding to the temperature of the battery 110 and the SOC of the battery 110 from the memory. In some embodiments, the memory may be the memory 160 of the battery management system.

Next, at S740, the processor 150 estimates the surface SOC SSOC[t+1] at the time point (t+1) based on the surface SOC SSOC[t], the reaction rate K[t], and the diffusion resistance D[t] estimated at time point t, using the surface SOC estimation model. In some embodiments, the processor 150 may estimate the surface SOC SSOC[t+1] as in Equation 1 or 2.

$$SSOC[t+1]=SSOC[t]+(K[t]+D[t])\cdot \Delta t \qquad \text{Equation 1}$$

$$SSOC[t+1]=SSOC[t]+(Kc\cdot I[t]+Dc\cdot \Delta SOC[t])\cdot \Delta t \qquad \text{Equation 2}$$

In Equations 1 and 2, $\Delta t$ denotes a time change (time difference) between time point (t+1) and time point t.

In some embodiments, the surface SOC estimation model may accurately estimate the surface SOC by repeatedly performing the estimation of the surface SOC. In some embodiments, an adaptive filter may be used as the surface SOC estimation model.

According to above-described embodiments, the state of the battery 110 can be accurately estimated by using the surface SOC that can accurately represent the potential of the electrode surface of the battery 110.

Next, embodiments of estimating a terminal voltage of the battery 110 using a surface SOC are described with reference to FIG. 8, FIG. 9, and FIG. 10.

Figure 8:
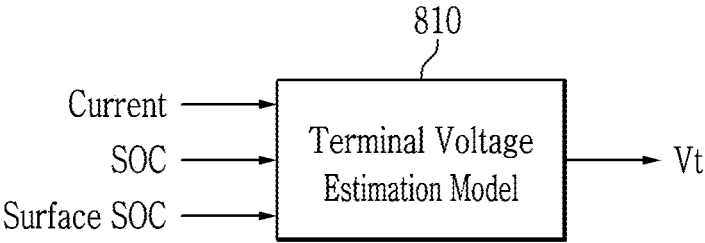
FIG. 8 is a diagram for explaining battery terminal voltage estimation in a battery management system according to an embodiment.
Figure 9:
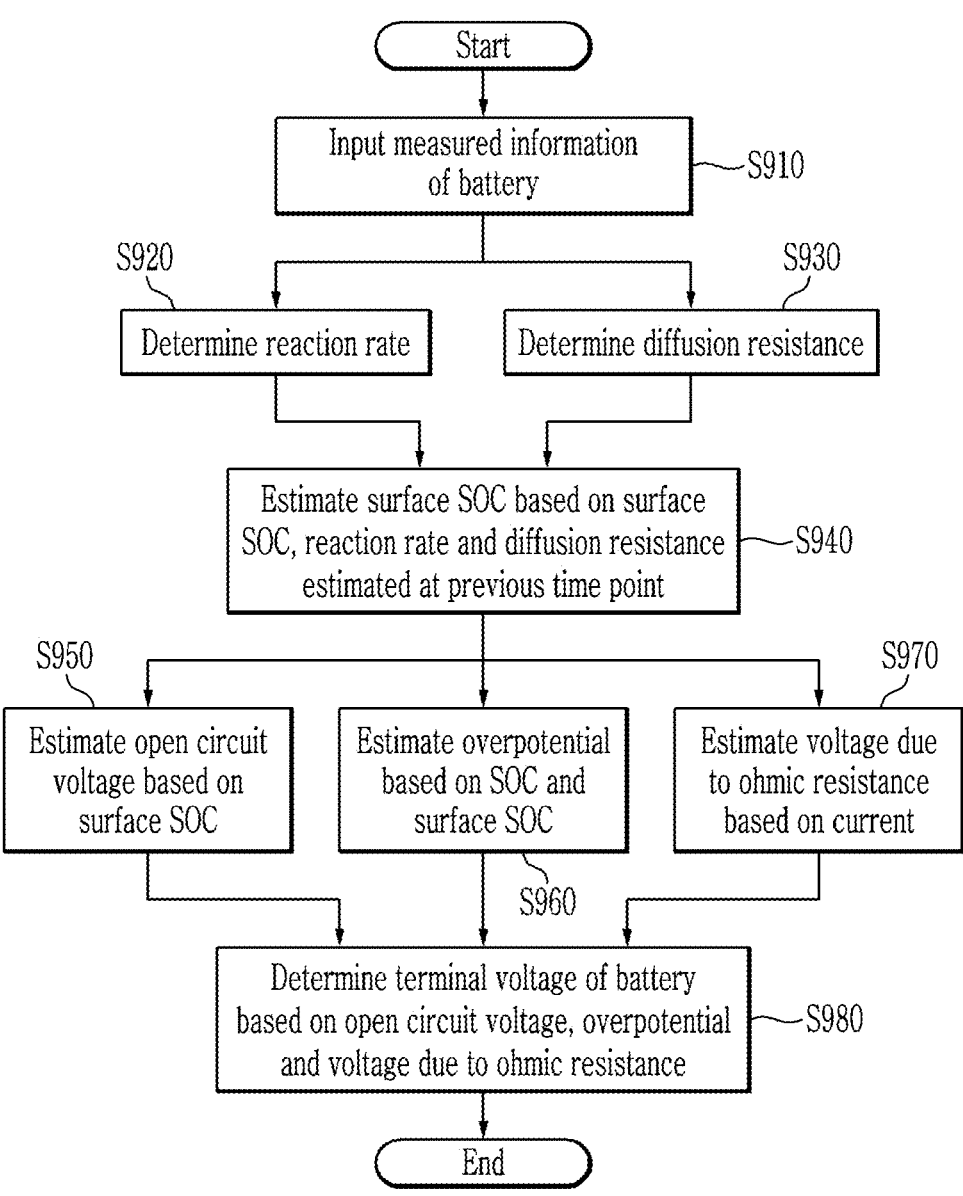
FIG. 9 is a flowchart showing a battery terminal voltage estimation method in a battery management system according to an embodiment.
Figure 10:
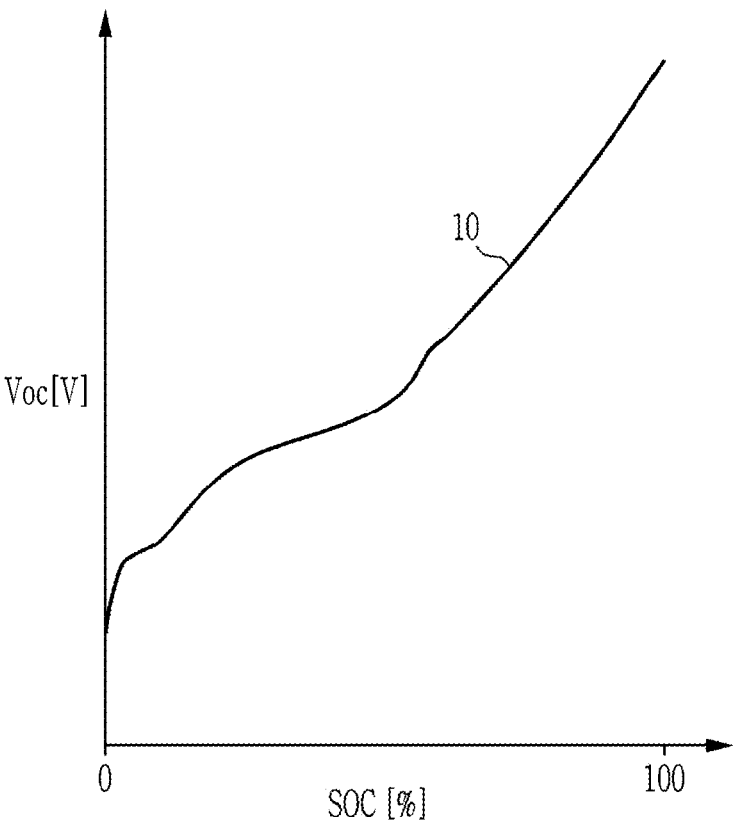
FIG. 10 is a diagram showing an example of a correspondence relationship between an SOC and an open circuit voltage in a battery according to an embodiment.

FIG. 8 is a diagram for explaining battery terminal voltage estimation in a battery management system according to an embodiment, FIG. 9 is a flowchart showing a battery terminal voltage estimation method in a battery management system according to an embodiment, and FIG. 10 is a diagram showing an example of a correspondence relationship between an SOC and an open circuit voltage in a battery according to an embodiment.

Referring to FIG. 8 and FIG. 9, a processor (e.g., 150 of FIG. 1) estimates a surface SOC using a surface SOC estimation model (e.g., 410 of FIG. 4). That is, as described with reference to FIG. 7, the processor inputs measured information of the battery (110 in FIG. 1) to the surface SOC estimation model 410 at S910, calculates a reaction rate K[t] and a diffusion resistance D[t] of the battery 110 at S920 and S930, and estimate the surface SOC SSOC[t+1] based on the reaction rate K[t] and the diffusion resistance D[t] at S940.

Next, the processor 150 inputs the SOC, the surface SOC, and a current of the battery 110 to a terminal voltage estimation model 810, and estimates a terminal voltage of the battery 110 using the terminal voltage estimation model 810.

To this end, the processor 150 estimates an open circuit voltage of the battery 110 based on the surface SOC at S950. The processor 150 may estimate the open circuit voltage Voc based on a non-linear functional relationship Voc=f(SSOC) between the surface SOC SSOC and the open circuit voltage Voc. In general, a memory (e.g., 160 in FIG. 1) of the battery management system stores a correspondence relationship between the open circuit voltage Voc of the battery 110 and the SOC of the battery 110 in advance. For example, the correspondence relationship between the open circuit voltage Voc and the SOC may be defined as shown in FIG. 10. In this case, the processor 150 determines the open circuit voltage Voc by inputting the surface SOC instead of the SOC. For example, when the surface SOC is 70%, the processor 150 may extract an open circuit voltage corresponding to the SOC of 70% from the memory. In some embodiments, the correspondence relationship between the open circuit voltage and the SOC may be stored per temperature. In this case, the processor 150 may determine the open circuit voltage based on the correspondence relationship between the SOC and the open circuit voltage, corresponding to the temperature of the battery 110, among various correspondence relationships.

Further, the processor 150 estimates an overpotential due to polarization at S960. Since the overpotential is caused by deviation of a potential at an electrode surface from an equilibrium potential, the processor 150 estimates the overpotential based on the surface SOC representing the potential at the electrode surface and the SOC representing the equilibrium potential. In some embodiments, the processor 150 may estimate the overpotential based on a value obtained by comparing the SOC and the surface SOC. In one embodiment, the value obtained by comparing the SOC and the surface SOC may be a ratio of the SOC and the surface SOC. In another embodiment, the value obtained by comparing the SOC and the surface SOC may be a difference between the SOC and the surface SOC. In some embodiments, the processor 150 may estimate the overpotential $V1[t+1]$ at time point (t+1) based on the overpotential $V1[t]$, the SOC SOC[t], and the surface SOC SSOC[t] at time point t, using the terminal voltage estimation model 810. In some embodiments, the processor 150 may estimate the overpotential $V1[t+1]$, for example, as in Equation 3.

$$V1[t+1]=V1[t]+\alpha(SOC[t]/SSOC[t]) \qquad \text{Equation 3}$$

In Equation 3, $\alpha$ denotes an overpotential coefficient.

In some embodiments, the overpotential coefficient $\alpha$ may be determined by experiments. In some embodiments, the overpotential coefficient $\alpha$ may be determined by repeatedly performing overpotential estimation using an adaptive filter. In some embodiments, the processor 150 may predefine an initial value V1[0] of the overpotential for estimating the overpotential.

In addition, the processor 150 estimates a voltage due to an ohmic resistance of the battery 110 at S970. The processor 150 estimates the voltage Vohmic due to the ohmic resistance as a product of the ohmic resistance of the battery 110 and the current of the battery 110. In some embodiments, the processor 150 may estimate the ohmic resistance using any one of various known methods, and the present invention is not limited to the method for estimating the ohmic resistance.

Next, the processor 150 determines the terminal voltage of the battery 110 based on the open circuit voltage Voc, the overpotential V1, and the voltage Vohmic due to the ohmic resistance at S980. In some embodiments, as shown in Equation 4, the processor 150 may determine a sum of the open circuit voltage Voc, the overpotential V1, and the voltage Vohmic by the ohmic resistance as the terminal voltage Vt of the battery 110.

$$Vt=Voc+V1+Vohmic \qquad \text{Equation 4}$$

While the surface SOC estimating method or the terminal voltage estimating method has been described in a case of discharging the battery, the surface SOC estimating method or the terminal voltage estimating method according to above-described embodiments may be applied to a case of charging the battery. As shown in FIG. 3, in the discharging, the surface SOC representing the surface concentration appears lower than the SOC representing the average concentration, whereas in the charging, the surface SOC may appear higher than the SOC.

According to the above-described embodiments, by estimating the surface SOC representing the potential at the electrode surface based on the current of the battery and the oxidation/reduction reaction of the active material, it is possible to accurately estimate the state of the battery not only in a static state of the battery but also in a dynamic state in which charging or discharging is repeated.

Next, a method for predicting a battery output in a battery management system according to an embodiment is described with reference to FIG. 11 and FIG. 12.

Figure 11:
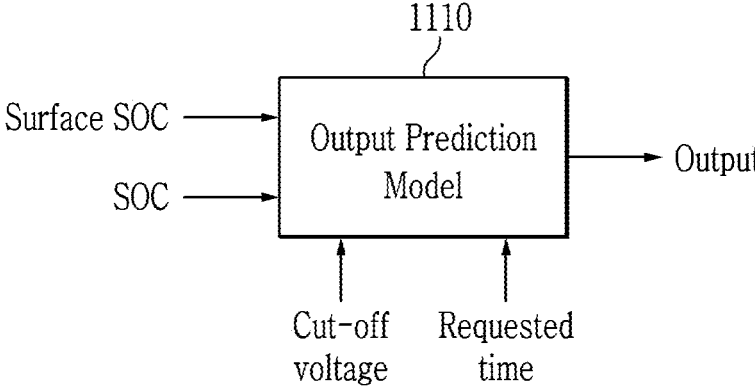
FIG. 11 is a diagram for explaining battery output prediction in a battery management system according to an embodiment.

FIG. 11 is a diagram for explaining battery output prediction in a battery management system according to an embodiment, and FIG. 12 is a flowchart showing a battery output prediction method in a battery management system according to an embodiment.

Referring to FIG. 11 and FIG. 12, a processor (e.g., 150 in FIG. 1) predicts a battery output using an output prediction model 1110. The processor 150 receives a desired requested time from an external apparatus (e.g., a vehicle) at S1210. Accordingly, the processor 150 may predict the battery output (e.g., power) for the requested time and provide the battery output to the vehicle.

In order to predict the battery output, the processor 150 inputs a state of a battery estimated at a current time point to the output prediction model 1110 at S1220. In some embodiments, the state of the battery may include a surface SOC described above. In some embodiments, the processor 150 may additionally input an SOC calculated at the current time point to the output prediction model 1110 at S1220. Further, the processor 150 inputs a cut-off voltage and the requested time received from the vehicle to the output prediction model 1110 at S1220. In some embodiments, the cut-off voltage may be a lower-limit voltage upon discharging of the battery 110. In some embodiments, the processor 150 may determine the cut-off voltage based on a temperature of the battery 110. In some embodiments, a correspondence relationship between the temperature of the battery 110 and the cut-off voltage may be predefined. In some embodiments, a memory (e.g., 160 in FIG. 1) of a battery management system may store the correspondence relationship. In some embodiments, the processor 150 may determine the cut-off voltage in response to a request from the external apparatus.

The output prediction model 1110 predicts the battery output based on the surface SOC, the cut-off voltage, and the request time at S1230, S1240, and S1250. In some embodiments, the output prediction model 1110 may determine the surface SOC at a time when the terminal voltage of the battery becomes the cut-off voltage at S1230, and estimate, based on the inputted surface SOC, a current for allowing the surface SOC at the time when the terminal voltage becomes the cut-off voltage to be estimated after the requested time at S1240.

In some embodiments, as described with reference to FIG. 8 and FIG. 9, the terminal voltage of the battery may be determined based on an open circuit voltage Voc of the battery, an overpotential V1, and a voltage due to an ohmic resistance, and the voltage due to the ohmic resistance may be determined as a product of a magnitude of the ohmic resistance R0 and a magnitude of the current of the battery. As described above, since the overpotential V1 and the ohmic resistance R0 can be estimated and converge to specific values after a certain time elapses, the output prediction model 1110 may estimate the open circuit voltage Voc and the current I of the battery at the time when the terminal voltage of the battery reaches the cut-off voltage Vc. In one embodiment, the output prediction model 1110 may estimate the open circuit voltage Voc and the current I of the battery based on Equation 5. In this case, the open circuit voltages Voc corresponding to various magnitudes I of the current may be estimated, respectively.

$$Vc = Voc + V1 + R0 \cdot I \qquad \text{Equation 5}$$

In Equation 5, the cut-off voltage Vc, the overpotential V1, and the magnitude R0 of the ohmic resistance have predetermined values.

As described with reference to FIG. 4 to FIG. 7, since the open circuit voltage of the battery is determined by the surface SOC, the output prediction model 1110 may determine, based on the estimated open circuit voltage Voc the surface SOC SSOC[k+1] at the time when the terminal voltage reaches the cut-off voltage. In some embodiments, the output prediction model 1110 may determine, based on the inputted surface SOC SSOC[k], the current I[k] for allowing the determined surface SOC SSOC[k+1] corresponding to the cut-off voltage to be estimated after the requested time Δt. In one embodiment, the output prediction model 1110 may predict the current I[k] of the battery based on Equation 6.

$$SSOC[k+1] = SSOC[k] + (Kc \cdot I[k] + D[k]) \cdot \Delta t \qquad \text{Equation 6}$$

In Equation 6, SSOC[k+1] is the surface SOC at the time when the terminal voltage reaches the cut-off voltage, SSOC [k] is the surface SOC that is inputted to the output prediction model 1110 and is estimated at a current time, and D[k] is a diffusion resistance, and Δt is the requested time. In some embodiments, D[k] may be determined based on the difference between the inputted surface SOC SSOC[k] and SOC SOC[k].

The output prediction model 1110 may determine the current of the battery that can satisfy Equations 5 and 6 at the same time. For example, the output prediction model 1110 may determine a combination, i.e., i.e., a current that can satisfy Equation 6 from among various combinations of the open circuit voltage Voc and the current that can satisfy Equation 5.

The processor 150 may predict a battery output during the requested time based on the current estimated through the output prediction model 1110 and provide the predicted battery output to a vehicle at S1250. In some embodiments, the output prediction model 1110 may predict the estimated current of the battery as a current that the battery can provide during the requested time. In some embodiments, the output prediction model 1110 may calculate battery power based on the estimated current of the battery, and predict the calculated battery power as power that the battery can provide during the requested time.

According to the above-described embodiments, it is possible to accurately predict and provide power that the battery can provide during a time requested by the external apparatus (e.g., the vehicle) in real time. In some embodiments, the battery management system may predict the output based on the periodically estimated surface SSOC, so that the output can be predicted in consideration of the battery usage history. In some embodiments, the battery management system may predict the output by taking the cut-off voltage into account, thereby preventing the terminal voltage of the battery from falling below the cut-off voltage.

Figure 14:
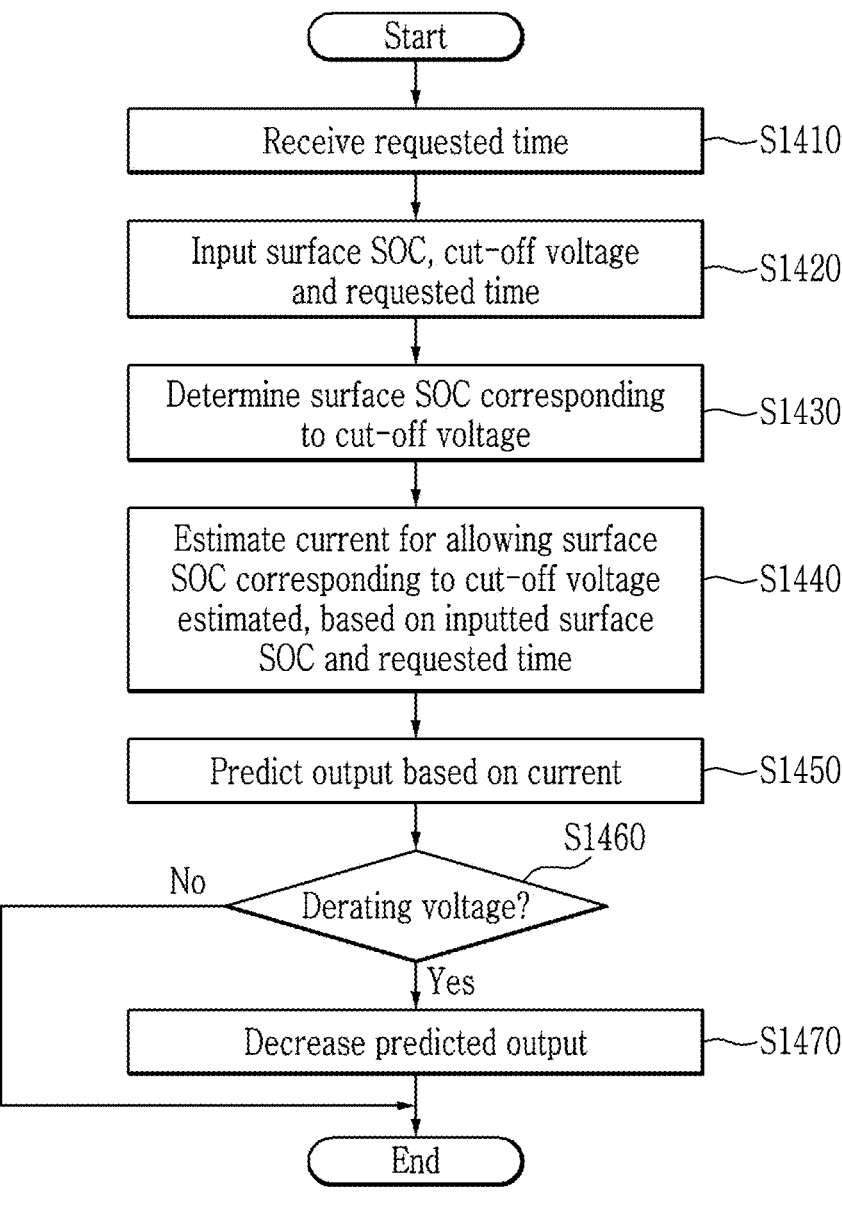
FIG. 14 is a flowchart showing a battery output prediction method in a battery management system according to another embodiment.

FIG. 13 is a diagram for explaining battery output prediction in a battery management system according to another embodiment, and FIG. 14 is a flowchart showing a battery output prediction method in a battery management system according to another embodiment.

Referring to FIG. 13 and FIG. 14, a processor (e.g., 150 in FIG. 1) predicts a battery output using an output prediction model 1310. The processor 150 receives a desired requested time from an external apparatus (e.g., a vehicle) at S1410. In order to predict the battery output, the processor 150 inputs a battery state estimated at a current time to the output prediction model 1310 at S1420. In some embodiments, the state of the battery may include a surface SOC. Further, the processor 150 inputs a cut-off voltage and the requested time received from the vehicle to the output prediction model 1310 at S1420. Furthermore, the processor 150 inputs a derating voltage to the output prediction model 1310 at S1420. In some embodiments, the processor 150 may determine the derating voltage based on a temperature of the battery 110. In some embodiments, a correspondence relationship between the temperature of the battery 110 and the derating voltage may be predefined. In some embodiments, a memory (e.g., 160 in FIG. 1) of a battery management system may store the correspondence relationship.

As described with reference to S1230, S1240 and S1250 in FIG. 12, the output prediction model 1310 estimates a current of the battery based on the surface SOC, the cut-off voltage and the requested time at S1430 and S1440), and predicts a battery output during the requested time based on the estimated current at S1450.

Next, the processor 150 determines whether a voltage of the battery (e.g., a terminal voltage of the battery) reaches the derating voltage at S1460. In some embodiments, the terminal voltage of the battery may be estimated as described with reference to FIG. 8 to FIG. 10. When the voltage of the battery reaches the derating voltage, the processor 150 decrease the predicted battery output by a predetermined ratio and provides the decreased battery output as the predicted battery output at S1470. In some embodiments, the processor 150 may decrease the battery power predicted by the output prediction model 1310 by the predetermined ratio and provide the decreased battery power as the predicted battery output. In some embodiments, the predetermined ratio may be a ratio that is defined in advance.

According to the above-described embodiments, when the battery output is predicted and provided, the battery output may be predicted in consideration of the derating voltage, so that the under-voltage diagnosis can be prevented from occurring due to the lowering of the battery voltage.

In some embodiments, the processor (e.g., 150 in FIG. 1) may perform computation on a program for executing the surface SOC estimation method, the terminal voltage estimation method, or the battery output prediction method described above. A program for executing the surface SOC estimation method, the terminal voltage estimation method, or the battery output prediction method may be loaded into a memory. The memory may be the same memory as a memory (e.g., 160 in FIG. 1) for storing a table or a separate memory. The program may include instructions for causing the processor 150 to perform the surface SOC estimation method, the terminal voltage estimation method, or the battery output prediction method when loaded into a memory. That is, the processor may perform an operation for the surface SOC estimation method, the terminal voltage estimation method, or the battery output prediction method by executing the instructions of the program.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus, comprising:
a battery; and
a processor configured to:
estimate a surface state of charge (SOC) representing a potential at an electrode surface of the battery as a first surface SOC;
determine the surface SOC at a time when a terminal voltage of the battery becomes a cut-off voltage as a second surface SOC;
estimate a current of the battery for allowing the second surface SOC to be estimated from the first surface SOC after a requested time; and
predict an output of the battery during the requested time based on the estimated current; and
manage the battery to output power to an external apparatus based on the predicted output.

2. The battery apparatus of claim 1, wherein the processor is further configured to:

determine an open circuit voltage of the battery at the time when the terminal voltage of the battery becomes the cut-off voltage; and
determine the second surface SOC based on the open circuit voltage.

3. The battery apparatus of claim 1, wherein the terminal voltage is determined based on an open circuit voltage of the battery corresponding to the second surface SOC and a voltage corresponding to the current.

4. The battery apparatus of claim 2, wherein the terminal voltage is determined based on the open circuit voltage of the battery, the voltage corresponding to the current, and an overpotential of the battery.

5. The battery apparatus of claim 1, wherein the processor is further configured to determine the cut-off voltage based on a temperature of the battery.

6. The battery apparatus of claim 1, wherein the processor is further configured to decrease the predicted output in response to a voltage of the battery corresponding to the predicted output reaching a derating voltage.

7. The battery apparatus of claim 1, wherein the processor is further configured to estimate the first surface SOC based on a plurality of parameters including a first parameter determined based on a measured current of the battery and a second parameter determined based on an SOC of the battery.

8. The battery apparatus of claim 1, wherein the cut-off voltage and the requested time are received from the external apparatus.

9. A method of predicting an output of a battery, the method comprising:
estimating a surface state of charge (SOC) representing a potential at an electrode surface of the battery;
predicting an output of the battery during a requested time based on the estimated surface SOC, a cut-off voltage, and the requested time; and
managing the battery to output power to an external apparatus based on the predicted output,
wherein the predicting of the output of the battery includes:
estimating a current of the battery for allowing a specific surface SOC to be estimated from the estimated surface SOC after the requested time; and
predicting the output of the battery based on the estimated current, and
wherein a terminal voltage of the battery determined based on the specific surface SOC and the current is the cut-off voltage.

10. The method of claim 9, wherein the terminal voltage is determined based on an open circuit voltage of the battery corresponding to the specific surface SOC and a voltage corresponding to the current.

11. The method of claim 9, wherein the estimating of the surface SOC includes estimating the surface SOC based on a plurality of parameters including a first parameter determined based on a measured current of the battery and a second parameter determined based on an SOC of the battery.

12. The method of claim 9, further comprising:
determining the cut-off voltage based on a temperature of the battery.

13. The method of claim 9, further comprising:
decreasing the predicted output in response to a voltage of the battery corresponding to the predicted output reaching a derating voltage.

14. A processor for managing a battery, wherein the processor is configured to execute a program stored in a storage medium to:

estimate a surface state of charge (SOC) representing a potential at an electrode surface of the battery as a first surface SOC;

determine the surface SOC at a time when a terminal voltage of the battery becomes a cut-off voltage as a second surface SOC;

estimate a current of the battery for allowing the second surface SOC to be estimated from the first surface SOC after a requested time;

predict an output of the battery during a requested time based on the estimated current; and manage the battery to output power to an external apparatus based on the predicted output.

15. The processor of claim 14, further configured to execute the program stored in the storage medium to:

determine an open circuit voltage of the battery at the time when the terminal voltage of the battery becomes the cut-off voltage; and determine the second surface SOC based on the open circuit voltage.

16. The processor of claim 14, wherein the terminal voltage is determined based on an open circuit voltage of the battery corresponding to the second surface SOC and a voltage corresponding to the current.

17. The processor of claim 16, wherein the terminal voltage is determined based on the open circuit voltage of the battery, the voltage corresponding to the current, and an overpotential of the battery.

18. The processor of claim 14, further configured to execute the program stored in the storage medium to determine the cut-off voltage based on a temperature of the battery.

19. The processor of claim 14, further configured to execute the program stored in the storage medium to decrease the predicted output in response to a voltage of the battery corresponding to the predicted output reaching a derating voltage.

20. The processor of claim 14, further configured to execute the program stored in the storage medium to estimate the first surface SOC based on a plurality of parameters including a first parameter determined based on a measured current of the battery and a second parameter determined based on an SOC of the battery.

* * * * *